United States Patent [19]
Henkler et al.

[11] 4,109,317
[45] Aug. 22, 1978

[54] MAGNETIC THIN FILM STORAGE DEVICE

[75] Inventors: Herbert Henkler; Hermann Deichelmann; Roland Koenig; Volker Koch, all of Ludwigshafen; Bernd Roeger, Limburgerhof, all of Fed. Rep. of Germany

[73] Assignee: BASF Aktiengesellschaft, Ludwigshafen, Fed. Rep. of Germany

[21] Appl. No.: 659,895

[22] Filed: Feb. 20, 1976

[30] Foreign Application Priority Data

Mar. 4, 1975 [DE] Fed. Rep. of Germany ....... 2509287

[51] Int. Cl.² .................................. G11C 19/08
[52] U.S. Cl. .......................................... 365/133
[58] Field of Search ............................ 340/174 ZB

[56] References Cited
U.S. PATENT DOCUMENTS 3,889,246  6/1975  Battarel .................. 340/174 ZB Primary Examiner—James W. Moffitt
Attorney, Agent, or Firm—Keil, Thompson & Shurtleff

[57] ABSTRACT

A magnetic thin film storage device of simplified design working on the shift register principle and comprising a flat support to which a ferromagnetic layer has been applied, which layer contains regions of different coercivity, lower-coercivity regions being surrounded by regions of higher coercivity, and also comprising electric conductors extending in planes which are parallel to the support, the conductors serving to produce the magnetic fields required to propagate magnetic domains into the lower-coercivity regions, at least one group of channels being provided which terminate in the same enlarged lower-coercivity area, and the magnetic domains contained in the channels terminating in the said enlarged area being propagated individually and consecutively into that enlarged area.

The components of thin-film storage devices of this type can be easily brought into register with the aid of mechanical stops or similar devices and their production can thus be largely automated; besides, the risk of random errors occurring in the flow of data can be substantially reduced, owing to the particularly simple geometric shape of the channels.

2 Claims, 12 Drawing Figures

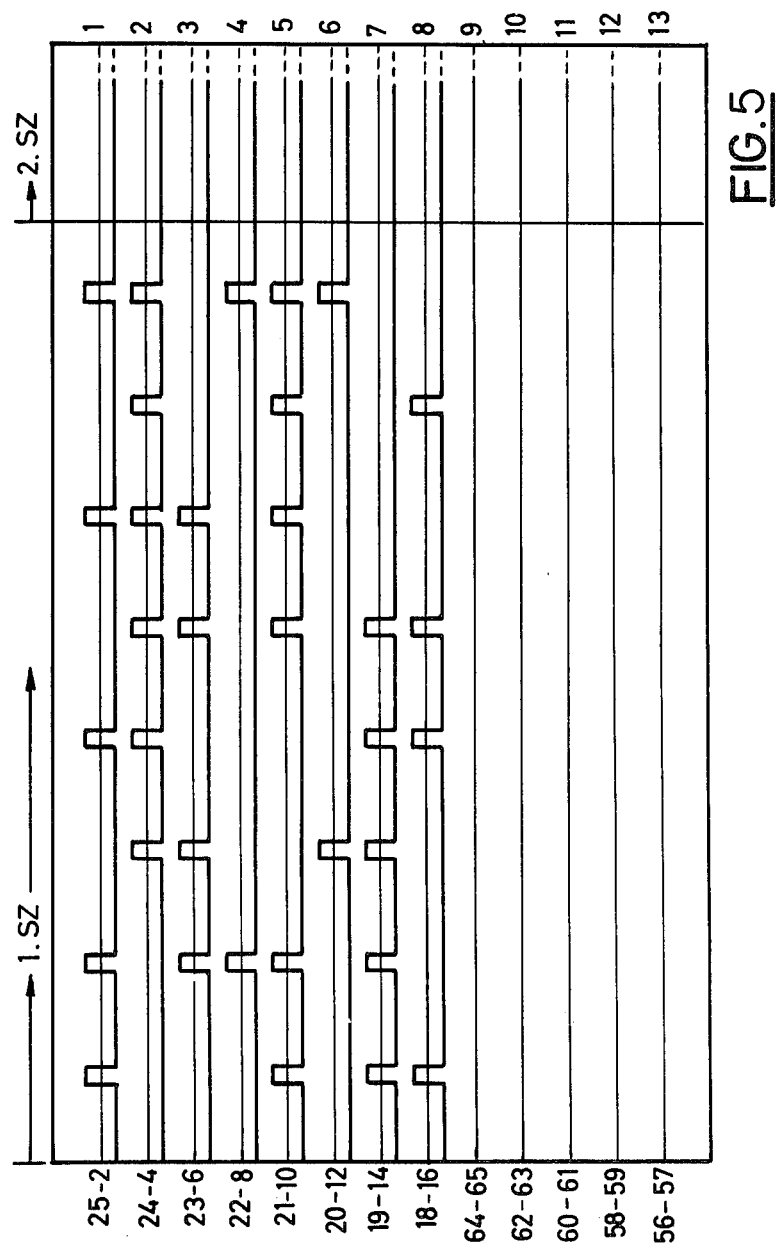

MAGNETIC THIN FILM STORAGE DEVICE

This invention relates to a magnetic thin film storage device of simplified design which comprises
(a) a flat support to which a ferromagnetic layer has been applied, which layer contains regions of different coercivity, lower-coercivity regions being surrounded by regions of higher coercivity, and also comprises
(b) electric conductors extending in planes parallel with the support, which serve to produce the magnetic fields required to propagate magnetic domains into the lower-coercivity regions.

Magnetic thin film storage devices with shifting magnetic domains are already known. Magnetic domains are regions of spontaneous magnetization. If such thin layers consist of a ferromagnetic material of uniaxial anisotropy, it is possible to allocate the binary values "1" and "0" to the two preferred states of magentization.

As is the case with known magnetization reversal processes, the direction of magnetization of one region can be extended into another region by means of an external field. The external magnetic field should however only be strong enough, in conjunction with the component of a first region, to reverse the magnetization of a second region, without orienting other regions. So that this propagation process can proceed in a controlled manner, the magnetic thin film storage device must have preferred directions of propagation. This is achieved by arranging zones (hereinafter referred to as "channels") of relatively low coercivity within regions of higher coercivity. The higher-coercivity regions are pre-magnetized to the point of saturation and serve to avoid the formation of marginal domains at the channel edges. Those channel regions whose magnetization is antiparallel to the magnetization outside the channels are defined as binary "1." By means of electric conductors taken across the channels, appropriate magnetic fields can be produced with a periodic sequence of current pulses, which fields advance the domains acting as information carriers from one storage location to the next, as in a shift register (cf. R. J. Spain, J. Appl. Phys., 37, 2572 (1966)), the following individual steps being required: creation, propagation and detection of the domains, all of which steps are effected by a suitable sequence of magnetic pulses, generated by an appropriately arranged system of conductors (U.S. Pat. No. 3,611,328). Detection may of course also be achieved by means of Hall or Kerr effects.

The physical principles of magnetic thin film storate devices with moving domains are well known. It is also known that it is necessary for the ferromagnetic layers used in such storage devices to have a very low coercivity in the channels, at least three times as large an anisotropic coercivity, and an even larger coercivity outside the channels. Furthermore, it has been shown that the requisite properties can be advantageously achieved with Ni/Fe/Co alloys if an aluminum layer is applied outside the channels between the support and the magnetic layer (cf. R. J. Spain, J. Appl. Phys., 37, 2572 (1966)). An embodiment of a magnetic thin film storage device is described in the same paper. This storage device which has a linear storage density of 6 bits/cm (= 16 bits/inch) is characterized by a very complex conductor pattern. This embodiment has the disadvantage, quite apart from its low storage density, that the electric conductors are very expensive to produce.

Magnetic thin film storage devices are also known in which narrow channels of zig-zag shape are applied to the support (U.S. Pat. No. 3,438,016). Shifting of the domains in the channels can be effected in the direction of the easy axis as well as perpendicular thereto. Upon completion of a shift cycle, the domains are situated in storage locations defined by the corners of the zig-zag pattern. One of the disadvantages of this storage device is that a very high degree of accuracy is necessary with regard to adjustment of the substrate relative to the planar components bearing the control conductors, which makes low-cost automated production of the device much more difficult.

Furthermore, magnetic thin film storage devices are known in which, owing to the employment of a special channel shape which, for certain strengths of magnetic fields, permits domain propagation in the channel in one direction only, the number of electric conductors necessary for operation of the device is reduced (U.S. Pat. No. 3,465,316). The main disadvantage of these devices is the complexity of the channel pattern.

The construction of all hitherto known magnetic thin film storage devices requires the extremely careful adjustment of the channel pattern relative to the electrical conductor systems, and also of these conductor systems relative to one another.

An object of the invention is to so design a magnetic thin film storage device that the components thereof can be easily brought into register with the aid of mechanical stops or similar means. In particular, the device of the invention is intended to render the use of optical adjusting instruments, e.g. microscopes, superfluous. A further object of the invention is to so design a magnetic thin film storage device that it can, as far as possible, be assembled by automatic machines and devices, i.e., without manual operations.

It is yet another object of the invention to reduce the risk of random errors occurring in the data flow, as compared with known devices, by providing channels of particularly simple geometric shape.

We have found that magnetic thin film storage devices comprising
(a) a flat support to which a ferromagnetic layer has been applied, which layer contains regions of different coercivity, lower-coercivity regions in the form of strip-like channels and enlarged areas being surrounded by regions of higher coercivity, and also comprising
(b) electric conductors extending in planes parallel with the support and serving to produce the magnetic fields required to propagate magnetic domains into the lower-coercivity regions
achieve the said objects if
(A) at least one group of channels is provided, which channels terminate in the same enlarged area of lower-coercivity, and
(B) the magnetic domains contained in the channels terminating in the said enlarged area can be propagated individually and consecutively, by means of suitable local magnetic fields, into that enlarged area.

We have also found that an especially simple storage device having the features (A) and (B) is obtained if the selection of a particular channel from the total number of channels terminating in the same enlarged area, the domains of which channel are to be propagated into that area, is effected by means of a local magnetic field which is produced by suitable currents in a suitably arranged, comb-like system of electric conductors. This comb-like system is arranged in a plane parallel to the magnetic layer in such a way that the longitudinal conductor crosses all channels of the group near the enlarged area and that the connection leads extend between the channels, which leads may also partly or wholly cover the enlarged area. In this embodiment, the magnetic field used to propagate the domains is produced by a single conductor covering the whole enlarged area as well as the adjacent channel regions.

We have furthermore found that a very simple storage device featuring the features (A) and (B) is obtained if the local magnetic fields required for the selection of a channel from the total number of channels terminating in the same enlarged area are produced by means of a system of hairpin-shaped electrical conductors which are arranged in such a way that each channel is crossed near the enlarged area by just one individual conductor whose connection leads extend between the channels, which leads may also partly or wholly cover the enlarged area. The magnetic field used to propagate the domains is again produced by an individual conductor covering the whole enlarged area as well as the adjacent channel regions.

The abovementioned individual conductor for producing the magnetic fields causing domain propagation may also be replaced by a plurality of closely spaced individual conductors extending parallel to one another, which conductors are activated by currents of the same polarity.

Further details of the invention are disclosed in the following description of the embodiments illustrated in the accompanying drawings; the functioning of the thin film storage device of the invention will be shown with reference to FIGS. 1 to 4 and pulse diagrams (FIGS. 5 to 8).

Planes A to D are arranged parallel to on another and as close together as possible such that all the mutually corresponding adjustment marks $aA$ to $aD$, $bA$ to $bD$ and $cA$ to $cD$ coincide.

Figure 4:
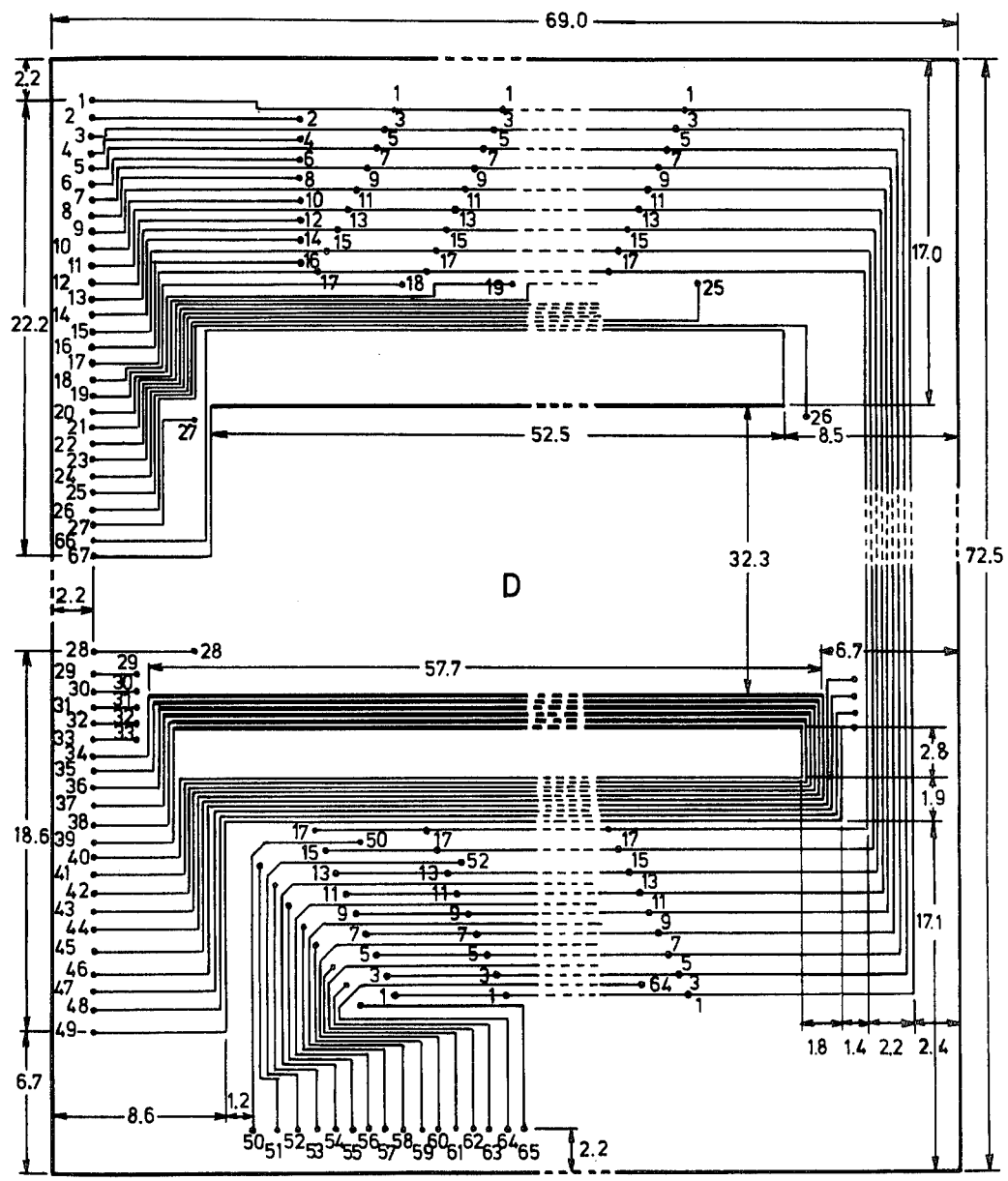
FIGS. 4 and 4a show a third plane with electrical conductor systems corresponding to the arrangement of FIG. 1, on a 5:1 scale (plane D).
Figure 4A:
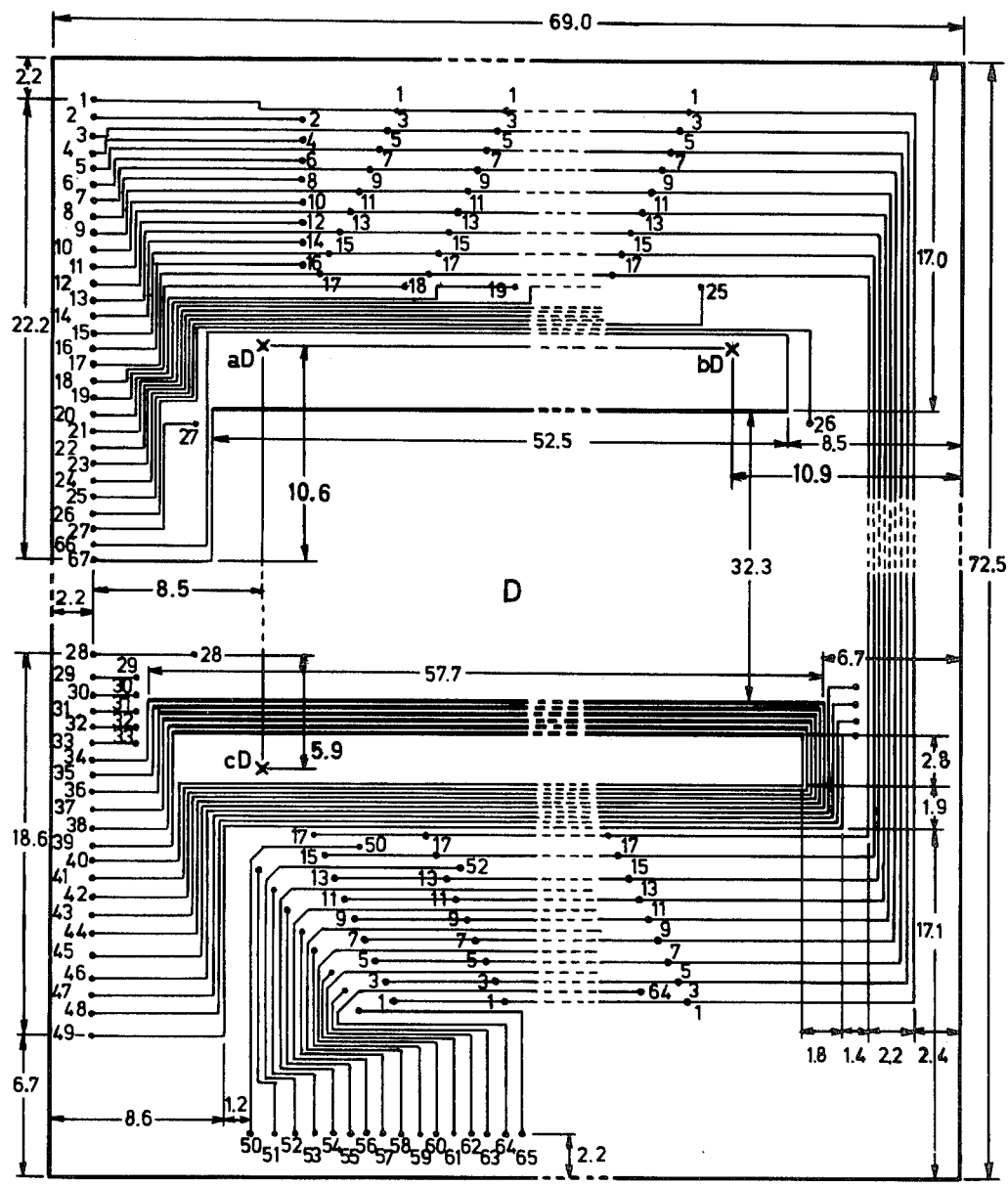
Figure 6:
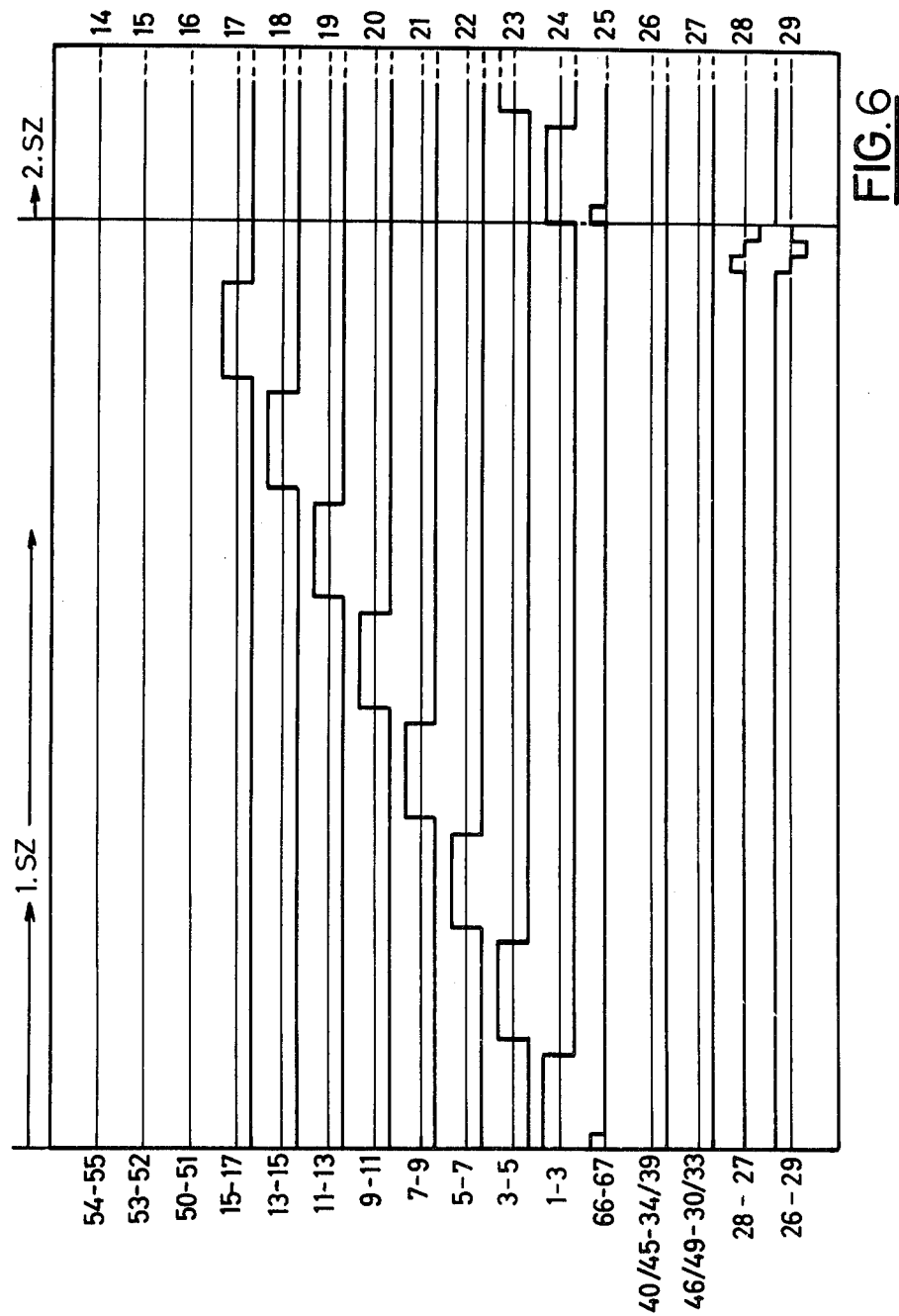

FIGS. 5 and 6 are pulse diagrams showing the pulse voltage as a function of time for all the connecting terminals of FIG. 4 or 4a, namely for the first and the beginning of the second shift cycle.

Figure 7:
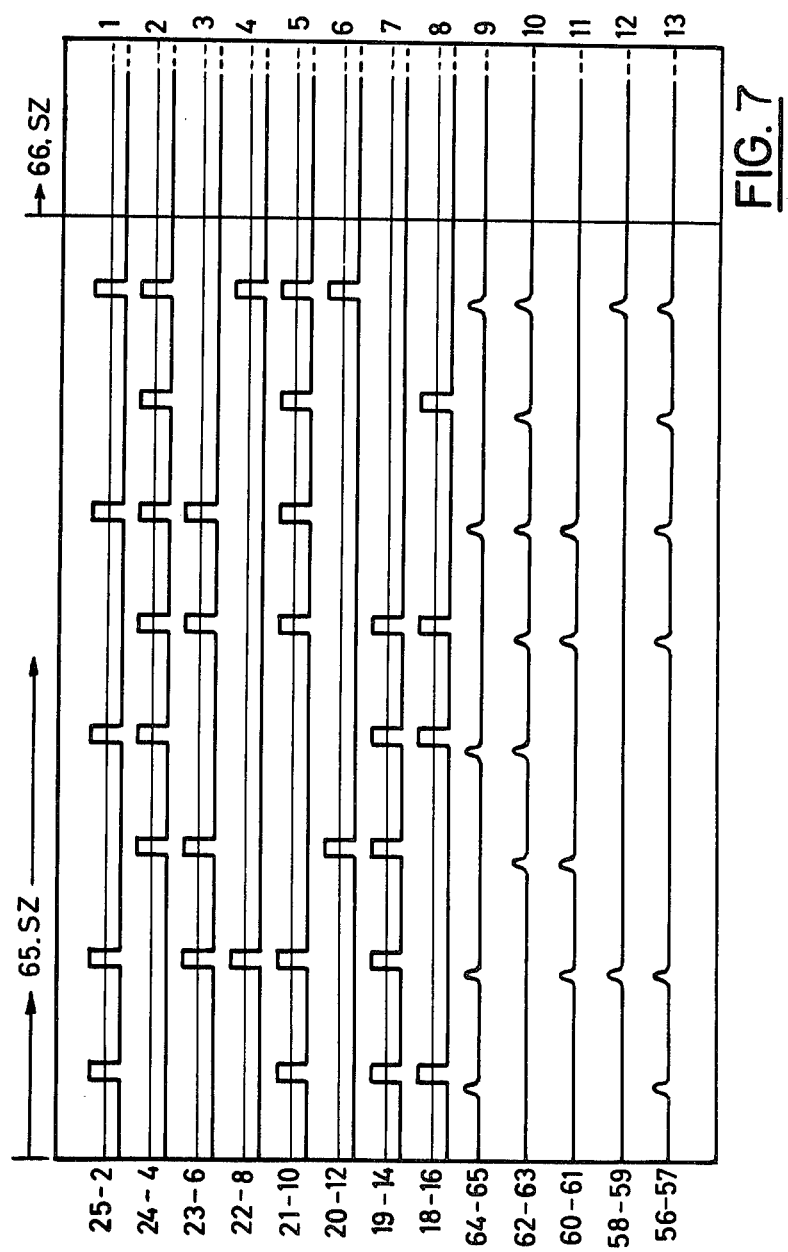
Figure 8:
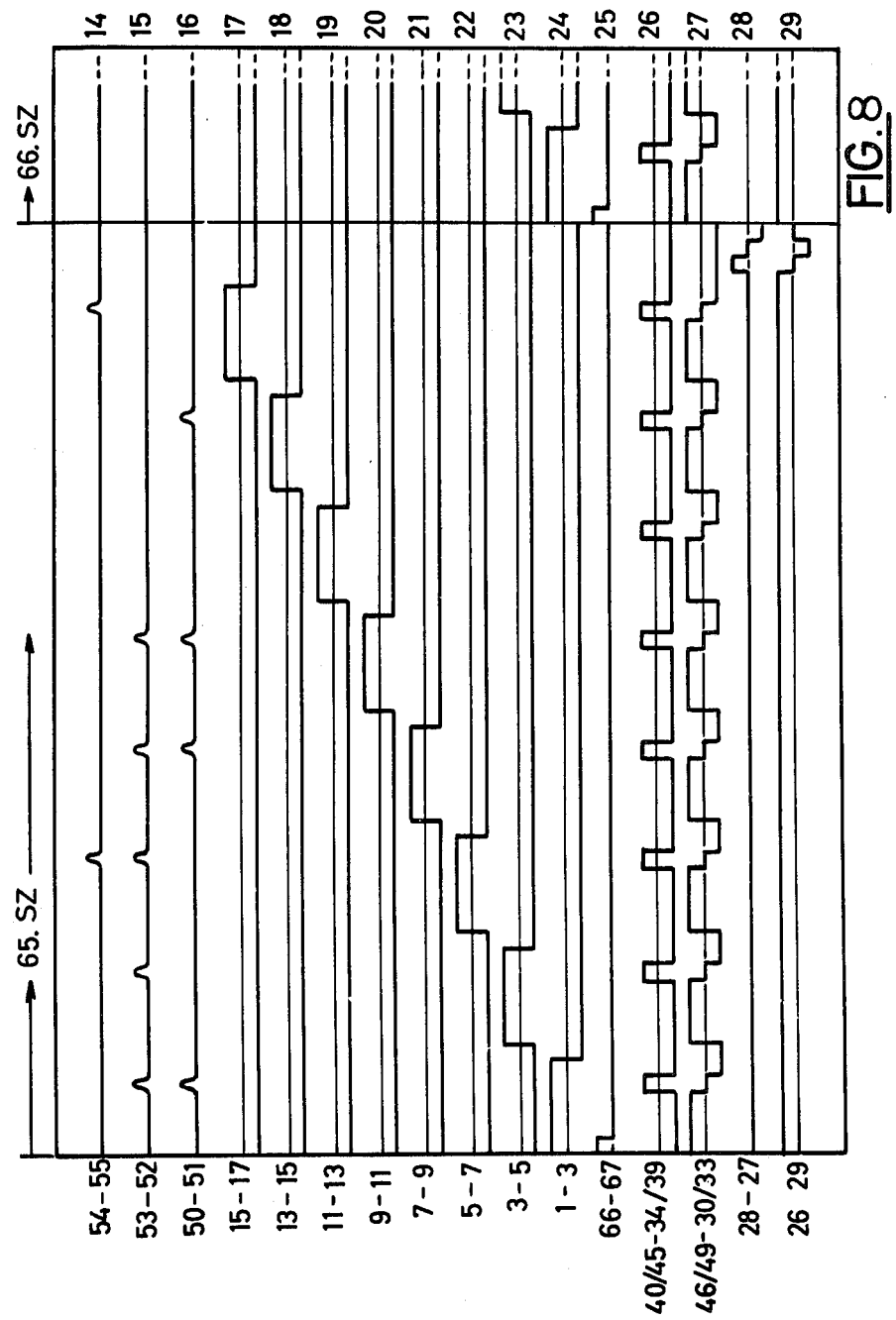

FIGS. 7 and 8 are pulse diagrams showing the pulse voltages as a function of time for all connecting terminals of FIG. 4 or 4a namely for the 65th and beginning of the 66th shift cycles.

Figure 1:
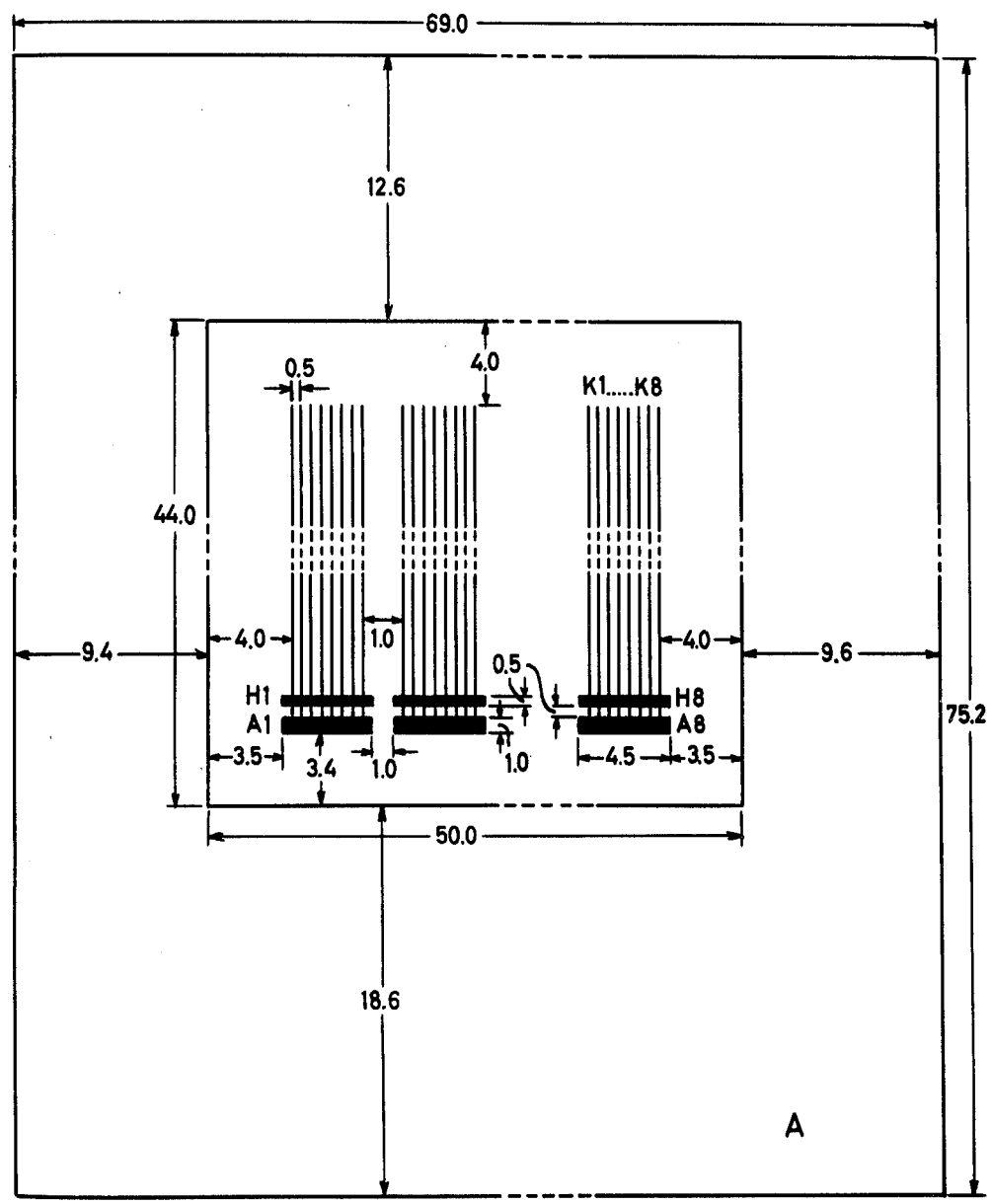
FIGS. 1 and 1a show the arrangement of soft magnetic channels and enlarged areas on a 5:1 scale (plane A) in the thin film storage device of the invention.
Figure 1A:
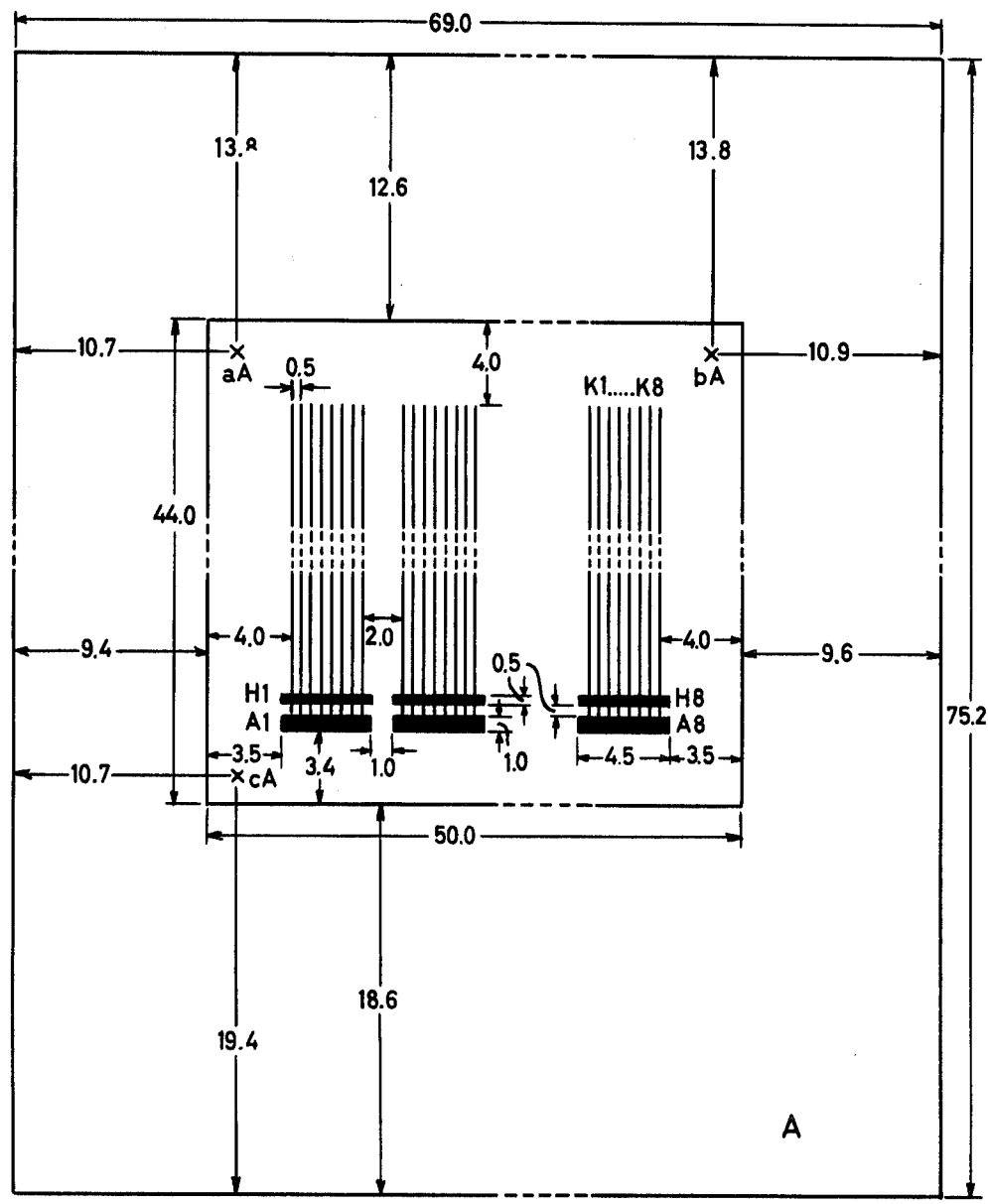

FIG. 1 shows, in plan view, a storage substrate according to the invention, with the eight soft magnetic enlarged areas A1 to A8, the eight soft magnetic enlarged areas H1 to H8 and the eight groups of soft magnetic channels (eight in each group) K1 to K8. Just one area H$n$ and just one area A$n$, $1 \leq n \leq 8$, are connected to every group of channels K1 to K8.

The width of each channel is 50 $\mu$m, the distance between any two adjacent channels in a group is 500 $\mu$m and the length of each channel from its upper end to where it terminates in H1 ... H8 is 34.7 mm. The areas H1 to H8 are rectangular in shape, measuring 0.5 × 4.5 mm; the areas A1 to A8 are likewise rectangular in shape, measuring 1 × 4.5 mm. The distance between adjacent pairs of areas is 1 mm. The lengths of the sides of the rectangular storage substrate shown in FIG. 1 are about 50 mm and 44 mm respectively. The groups of channels are arranged in such a way that a hard magnetic region at least 2 mm wide is left around the entire edge of the storage substrate.

The areas A1 to A8 and H1 to H8 do not have to be strictly rectangular in shape. In order to control domain propagation more easily, it is expedient to provide the edges of the enlarged areas with, for example, sawtooth-like triangular projections; this does not impair operation.

Figure 2:
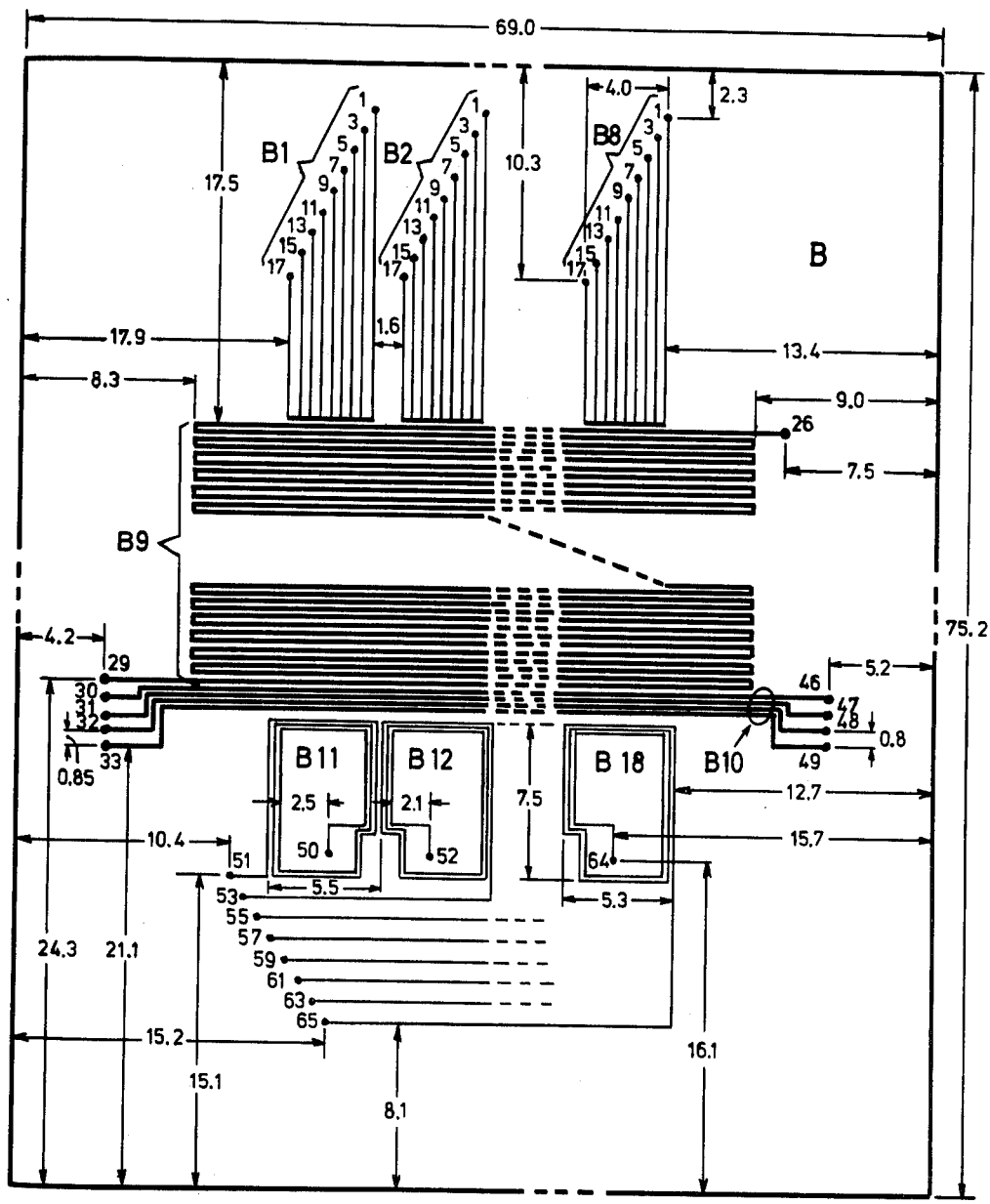
FIGS. 2 and 2a show a first plane with electrical conductor systems corresponding to the arrangement of FIGS. 1 and 1a, on a 5:1 scale (plane B).
Figure 2A:
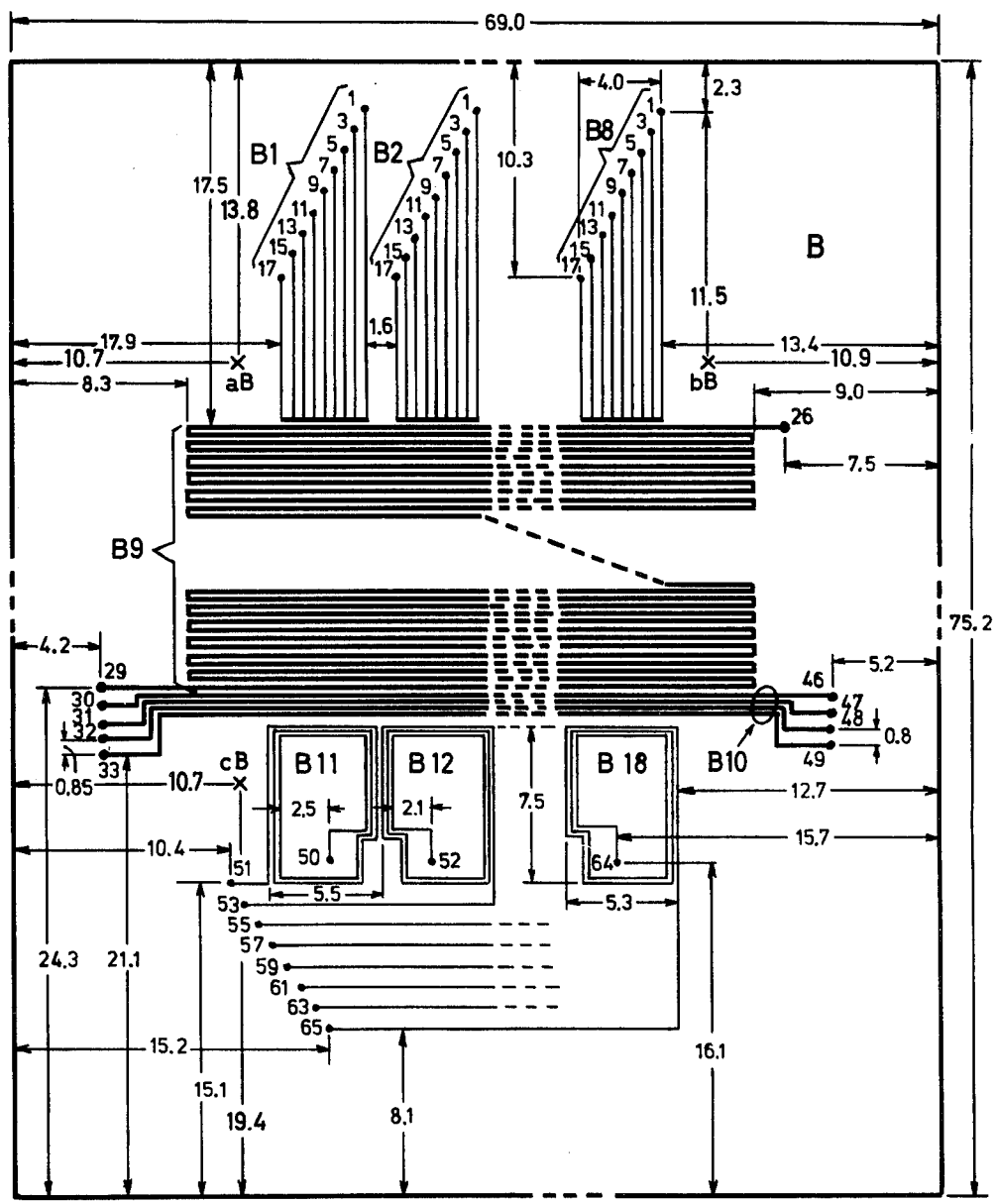

FIG. 2 shows the conductor systems arranged in plane B. The 8 conductor loops B11, B12 ... B18 with their terminals 50, 51, 52, 53 ..., 64, 65 are used for the inductive readout of stored information, just one soft magnetic area A1 to A8 (see FIG. 1) being allocated to each conductor loop. Each conductor loop consists of three turns, the width of the conductor being 50 $\mu$m and the space between turns also being 50 $\mu$m. They are arranged in such a way that their upper straight portion is situated above the areas A1 to A8 of FIG. 1. With such an arrangement, when the magnetization in one of the areas A1 to A8 is to be reversed, an inductive voltage of approximately 5 millivolts is obtained between the terminals of the loop concerned.

The geometrical shape of the conductor loop is approximately rectangular, the width being 5.2 mm and the height 7.5 mm. Between any two adjacent readout loops there is provided a free space about 100 $\mu$m wide. The distances between the eight connections leading to terminals 51, 53, 55 ... 63, 65 are in each case 1 mm. The diameter of the 16 terminal points 50 ... 65 is 0.3 mm.

The four conductors of system B10, with its terminal points 30, 31, 32, 33, 46, 47, 48, 49 are used for producing the magnetic fields which effect domain propagation or shrinkage in the areas H1 to H8. These four conductors cover the areas H1 to H8 and the channel regions situated between H1 ... H8 and A1 ... A8. The conductor with the terminals 30, 46 covers the channels K1 to K8 at the points where they join regions H1 to H8.

The four conductors B10 are each 200 $\mu$m wide and located at a distance of 50 $\mu$m from each other. They are activated by currents of identical polarity, so that their respective magnetic fields supplement each other.

In principle, the four individual conductors could be replaced by a single conductor of appropriate width. However, the resistance of the latter would be so low that difficulties would be encountered in the process of matching the electrical parameters.

The distance, in a straight line, between mutually corresponding terminal points, e.g., 33 to 49, is 59.6 mm, and the diameter of the terminal points is 300 $\mu$m.

The meandering single conductor B9, with its terminal points 26 and 29, is used for producing the local magnetic fields which effect domain propagation or shrinkage. Its width over its entire length is 200 $\mu$m ± 5 $\mu$m, the distance between adjacent conductor portions being 50 $\mu$m ± 10 $\mu$m. Commencing at point 26, the conductor extends from right to left over a distance of 53 mm, then from left to right over a distance of 51.8 mm, then again from right to left over a distance of 51.8 mm, then from left to right over a distance of 51.8 mm and so on. In all, 65 right-to-left and 64 left-to-right conductor portions are provided, the section starting at point 26 being the first right-to-left, and the section terminating at point 29 being the 65th right-to-left conductor portion which has a length of 55.8 mm.

The smallest distance between the portion of conductor B9 commencing at point 29 and the conductor of system B10 which connects points 30, 46 is 200 μm ± 20 μm.

The eight comb-like conductor systems B1, B2, ... B8, each with its nine terminal points 1, 3, 5 ... 15, 17, enable, during the process of writing information those channels to be selected in which data are to be stored. The transverse conductors running perpendicular to the channels have a width of 300 μm ± 20 μm and are each 4 mm long, and the nine current leads connected to each transverse conductor have a length of 6.8 mm to 14.8 mm, the difference in length of adjacent leads being in each case 1 mm. The distance between any two adjacent leads is 450 μm ± 20 μm, the width of the conductor being 50 μm ± 5 μm.

The conductor systems B1 to B8 are arranged in such a way that the upper ends of the soft magnetic channels are each situated centrally between two current leads. The space between the transverse conductors and the conductor portion commencing at point 26 of system B9 is 200 μm ± 20 μm.

Figure 3:
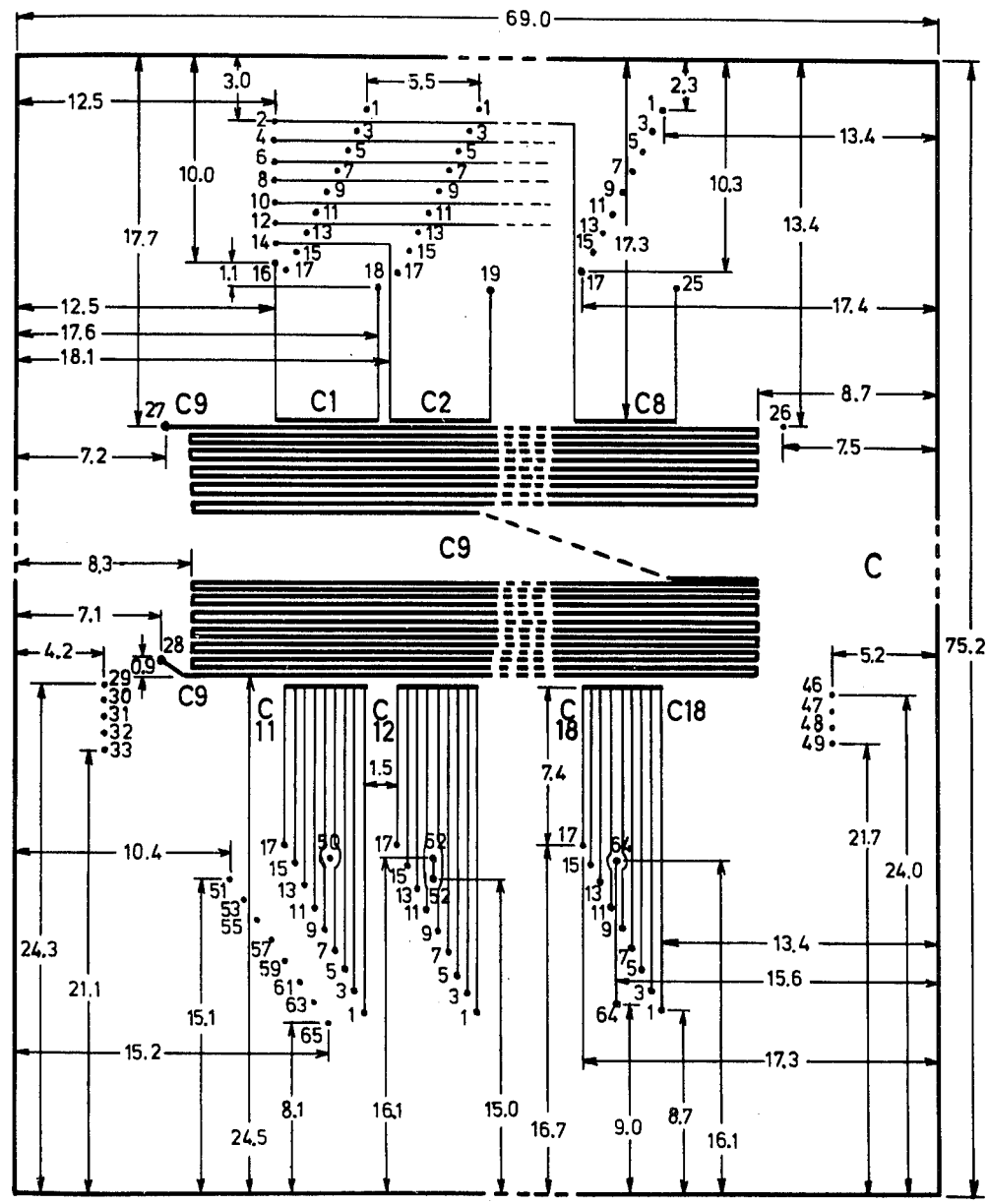
FIGS. 3 and 3a show a second plane with electrical conductor systems corresponding to the arrangement of FIGS. 1 and 1a, on a 5:1 scale (plane C).
Figure 3A:
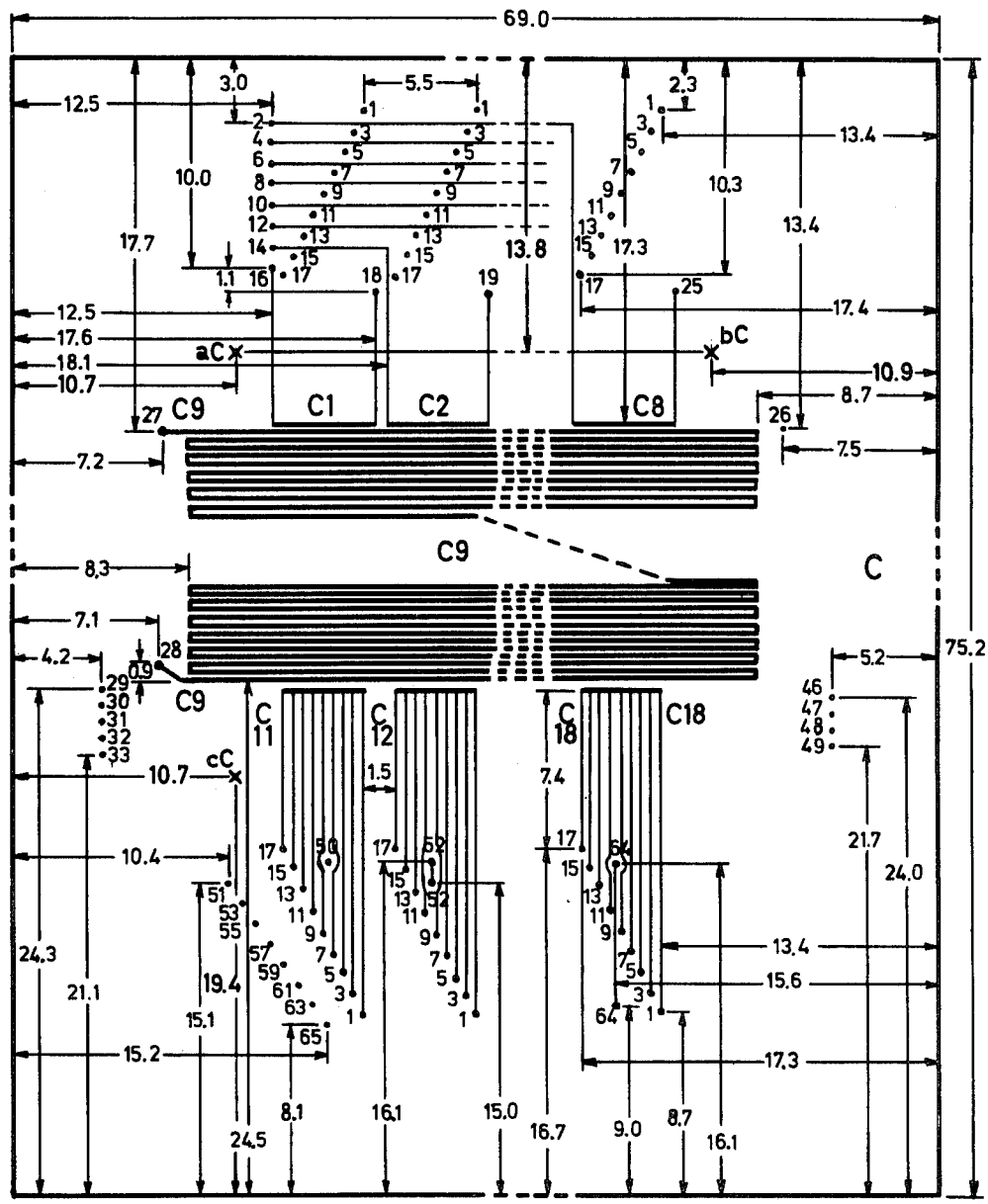

FIG. 3 shows the conductor systems arranged in plane C parallel to planes A and B, magnified five times. At the points 29 to 33, 46 to 65, 26, 1, 3, 5, 7, 9, 11, 13, 15 and 17, the planes B and C are electrically connected by through-hole plating.

The eight conductor systems C11, C12 to C18, with nine terminal points 1, 3, 5, ... 15, 17 in each case, are used for selecting those soft magnetic channels from which data are to be read. The width of the eight transverse conductors running perpendicular to the channels is 300 μm ± 20 μm, the length of the transverse conductors being 4 mm. In each case the nine leads which run parallel to the channels have a length of 7.5 to 15.5 mm, the difference in length of adjacent leads being 1 mm in each case, and a width of 50 μm ± 5 μm. The distance between any two adjacent leads is 450 μm ± 20 μm. The conductor systems are arranged in such a way that the transverse conductor symmetrically covers the 200 μm wide space between the portion of conductor B9, which is arranged in plane B and starts at point 29, and the conductor 30 to 36 of system B10, which conductor is likewise arranged in plane B. Furthermore, the arrangement is such that exactly mid-way between any two adjacent leads of the systems C11 to C18 there extends a soft magnetic channel in a direction parallel with these leads.

The leads of systems C11 to C18 are of such a geometrical shape that the through-hole platings 50, 52 ... 62, 64 connecting the corresponding points in plane B can be arranged in the intervening spaces.

The meandering single conductor C9 with terminals 27 and 28 serves the same purpose as conductor B9 in plane B. The individual conductor portions are 200 μm ± 5 μm wide and arranged at a distance of 50 μm ± 10 μm from each other. Their geometrical arrangement is such that, starting from point 27, left-to-right conductor portions are situated symmetrically above the space between the portion of conductor B9, starting from point 26 in plane B, and its neighbor, likewise arranged in plane B. The portion of conductor C9 connected to point 28 in plane C is likewise situated symmetrically above the space between the conductor portion of system B9, starting from point 29, and its neighbor in the B9 system.

Starting from point 27 in plane C there are 64 left-to-right and 64 right-to-left conductor portions, the last terminating in point 28.

The distance between the transverse conductors of systems C11 to C18 and the portion of conductor system C9 leading to point 28 is 200 μm ± 10 μm. The left-to-right conductor portion starting at point 27 has a length of 53 mm, while the other conductor portions are each 52 mm long. The connection to point 28 is at such an angle that point 28 is not situated above the conductor portion starting at point 29 in plane B.

The eight individual conductors C1 to C8 make it possible to decide whether, during a writing cycle, a logic "0" or a logic "0" is to be transmitted to the selected channels. The terminal points 16, 18, 14, 19, 12, 20 ..., 4, 24, 2, 25, have a diameter of 300 μm, the leads are 50 μm ± 5 μm wide and the transverse conductors arranged perpendicular to the soft magnetic channels are each 5 mm long and 300 μm wide. Their distance from the portion of the individual conductor C9 starting at point 27 is 200 μm ± 5 μm.

FIG. 4 shows conductor systems arranged in plane D parallel with the planes A, B and C. They serve as current leads for the above-described electrical conductors. For this purpose, electrical connections to planes B and C are provided at numerous points in the form of through-hole platings. The conductor arrangement in plane D is such that all terminal contacts are grouped near the left-hand and lower edges and are thus easily accessible.

All the conductors in plane D have a width of at least 50 μm ± 5 μm and are located at a distance of at least 50 μm ± 5 μm from one another. In some cases, the conductors may be wider and may be arranged at a greater distance from one another.

The following Table 1 gives complete information as to which edge contacts in plane D are connected to contacts within the planes B and C. Identical numbers at several points of contact in FIGS. 2 to 4 signify that these points are electrically connected to one another.

Table 1

| Contact No. ... of Plane D | connected to Contact Nos. ... of Plane ... B | ... times | C | ... times |
| --- | --- | --- | --- | --- |
| 1 | 1 | 8 | 1 | 8 |
| 2 | — | — | 2 | 1 |
| 3 | 3 | 8 | 3 | 8 |
| 4 | — | — | 4 | 1 |
| 5 | 5 | 8 | 5 | 8 |
| 6 | — | — | 6 | 1 |
| 7 | 7 | 8 | 7 | 8 |
| 8 | — | — | 8 | 1 |
| 9 | 9 | 8 | 9 | 8 |
| 10 | — | — | 10 | 1 |
| 11 | 11 | 8 | 11 | 8 |
| 12 | — | — | 12 | 1 |
| 13 | 13 | 8 | 13 | 8 |
| 14 | — | — | 14 | 1 |
| 15 | 15 | 8 | 15 | 8 |
| 16 | — | — | 16 | 1 |
| 17 | 17 | 8 | 17 | 8 |
| 18 | — | — | 18 | 1 |
| 19 | — | — | 19 | 1 |
| 20 | — | — | 20 | 1 |
| 21 | — | — | 21 | 1 |
| 22 | — | — | 22 | 1 |
| 23 | — | — | 23 | 1 |
| 24 | — | — | 24 | 1 |
| 25 | — | — | 25 | 1 |
| 26 | 26 | 1 | — | — |
| 27 | — | — | 27 | 1 |

Table 1-continued

| Contact No. ... of Plane D | connected to Contact Nos. ... of Plane ... B | ... times | C | ... times |
|---|---|---|---|---|
| 28 | — | — | 28 | 1 |
| 29 | 29 | 1 | — | — |
| 30 | 30 | 1 | — | — |
| 31 | 31 | 1 | — | — |
| 32 | 32 | 1 | — | — |
| 33 | 33 | 1 | — | — |
| 34 | — | — | — | — |
| 35 | — | — | — | — |
| 36 | — | — | — | — |
| 37 | — | — | — | — |
| 38 | — | — | — | — |
| 39 | — | — | — | — |
| 40 | — | — | — | — |
| 41 | — | — | — | — |
| 42 | — | — | — | — |
| 43 | — | — | — | — |
| 44 | — | — | — | — |
| 45 | — | — | — | — |
| 46 | 46 | 1 | — | — |
| 47 | 47 | 1 | — | — |
| 48 | 48 | 1 | — | — |
| 49 | 49 | 1 | — | — |
| 50 | 50 | 1 | 50 | 1 |
| 51 | 51 | 1 | — | — |
| 52 | 52 | 1 | 52 | 1 |
| 53 | 53 | 1 | — | — |
| 54 | 54 | 1 | 54 | 1 |
| 55 | 55 | 1 | — | — |
| 56 | 56 | 1 | 56 | 1 |
| 57 | 57 | 1 | — | — |
| 58 | 58 | 1 | 58 | 1 |
| 59 | 59 | 1 | — | — |
| 60 | 60 | 1 | 60 | 1 |
| 61 | 61 | 1 | — | — |
| 62 | 62 | 1 | 62 | 1 |
| 63 | 63 | 1 | — | — |
| 64 | 64 | 1 | 64 | 1 |
| 65 | 65 | 1 | — | — |

The six individual conductors of the D1 system in plane D, with their terminal points 34 to 45, are used to produce the magnetic field effecting domain propagation or shrinkage in the region of the soft magnetic areas A1 to A8 of plane A (FIG. 1). The conductors are always activated simultaneously by currents of the same polarity, so that the local magnetic fields produced by them supplement each other. The six individual conductors of the D1 system together cover a strip approximately 1.8 mm wide in plane D. Each individual conductor is 250 μm ± 10 μm wide and separated from its neighbor by a space 50 μm ± 20 μm wide. The plane D conductor connected to edge contacts 34 and 45 covers the plane B conductor connected to points 33 and 49 over a strip-like area approximately 150 μm wide. The individual plane D conductor connected to edge contacts 39 and 40 covers the soft magnetic regions A1 to A8 of plane A over an area approximately 100 μm wide.

The individual conductor connected to the edge contacts 66, 67 in plane D is used for the controlled creation of domains at the upper end of the soft magnetic channels. It is about 350 μm wide and covers the eight transverse conductors of the eight comb-like conductor systems B2 to B8 of plane B over an area about 100 μm wide.

The lengths of the sides of plane D are approximately 72.5 and 69 mm respectively.

The tolerances within which the four planes A to D can be adjusted relative to one another are determined by the specified overlapping dimensions.

If the storage device is to function reliably, the following positional relationships constitute minimum requirements, which must be fulfilled even with maximum adjustment errors $\Delta_s$ in the vertical direction, and $\Delta_w$ in the horizontal direction:

Plane A/Plane B
B11 ... B18 must cover A1 ... A8.
Hence, $\Delta_s \leq \pm 370$ μm, $\Delta_w \leq \pm 200$ μm.
B10 must cover H1 ... H8.
Hence, $\Delta_s \leq \pm 225$ μm, $\Delta_w$ not critical.
The channels K1 ... K8 must be situated between the longitudinal conductors of B1 ... B8 and spaced apart from them by at least 100 μm.
Hence, $\Delta_s$ not critical, $\Delta_w \leq \pm 100$ μm.

Plane A/Plane B/Plane C
All through-hole-plated areas (diameter 300 μm in each case) must overlap each other in regions at least 150 μm wide.
Hence, $\Delta_s \leq \pm 150$ μm, $\Delta_w \leq \pm 150$ μm.
The turns of individual conductor C9 must always coincide with the spaces between the turns of conductor B9.
Hence, $\Delta_s = \pm 75$ μm, $\Delta_w$ not critical.
The channels K1 ... K8 must be situated between the longitudinal conductors of C11 ... C18 and spaced apart therefrom by at least 100 μm.
Hence, $\Delta_s$ not critical, $\Delta_w \leq \pm 100$ μm.
The transverse conductors of systems C11 ... C18 must not be situated above the soft magnetic regions H1 ... H8.
Hence, $\Delta_s \leq \pm 125$ μm, $\Delta_w$ not critical.
The transverse conductors of the systems C11 ... C18 must cover the gap between the conductor connecting points 30 and 46 in plane B and the portion of the conductor starting at point 29 in plane B, a gap of not more than 50 μm being left between said transverse conductors and said portion of the conductor starting at point 29.
Hence, $\Delta_s \leq \pm 100$ μm, $\Delta_w$ not critical.
All other positional conditions are not critical.

Plane D/Plane C/Plane B/Plane A
All through-hole-plated areas (diameter 300 μm) must overlap in regions at least 150 μm wide.
Hence, $\Delta_s \leq \pm 150$ μm, $\Delta_w \pm 150$ μm.
The conductor system of plane D must cover the areas A1 ... A8.
Hence, $\Delta_s = \pm 325$ μm, $\Delta_w$ not critical.
All other conditions are not critical.

To sum up, then, it can be said that proper functioning of the above-described embodiment is guaranteed if each of the four planes shows positional deviations relative to any of the other planes of ± 75 μm in the direction parallel to the soft magnetic channels, and of ± 100 μm perpendicular thereto.

The operation of the above-described embodiment will now be described with reference to the pulse programs of FIG. 5 to 8. They show the pulse characteristics as functions of time for every contact of FIG. 4. The following prerequisites were assumed:

(a) All indicated voltages are those of the first contact relative to the second contact.
(b) The magnetization of the substrate (plane A) runs parallel with the soft magnetic channels and is oriented in such a way that currents flowing from right to left in planes B to D produce a local reversal of magnetization (domain creation) or a growth of of already existing reversed-magnetization areas.

FIGS. 5 to 8 show, by way of example, two shift cycles of the data storage device of the invention; lines 1 to 8 show the input data, lines 9 to 16 the output data, lines 17 to 24 the pulses used for channel selection, line 25 the pulse which causes domain nucleation and lines 26 to 29 the pulses which cause domain propagation and shrinkage respectively.

In FIGS. 2 to 8, the following operations are assumed to take place:

During the first shift cycle, the eight hexadecimal numbers 8B, BA, 66, C3, 6B, E8, 49, DC are successively fed to the storage device. The bit sequence corresponding to each of these numbers (e.g. 8B = 10001011) is applied to the inputs (lines 1 to 8) in parallel. During this cycle, a readout does not occur.

During the second shift cycle and all following cycles up to and including the 64th cycle, all that happens is that the stored information is shifted along the channels to the next-following storage location each time. On completion of the 64th cycle, the data entered during the first cycle have reached the last (64th) storage location, while all the other storage locations are cleared, i.e., contain logic zeros. During the 65th storage cycle, the data stored during the first cycle are read out and immediately re-entered into storage location 1.

The allocation of storage locations to information bits is effected according to the following scheme:

1st hexadecimal number = [bit 8, bit 7, bit 6, . . . , bit 2, bit 1] maximum valence → minimum valence
Bit 8 → channel group A8, channel K8
Bit 7 → channel group A7, channel K8
Bit 6 → channel group A6, channel K8
.
.
. p1 Bit 2 → channel group A2, channel K8
Bit 1 → channel group A1, channel K8
2nd hexadecimal number
Bit 8 → channel group A8, channel K7
Bit 7 → channel group A7, channel K7
.
.
.
Bit 1 → channel group A1, channel K7
.
.
.
8th hexadecimal number
Bit 8 → channel group A8, channel K1
Bit 7 → channel group A7, channel K1
.
.
. Bit 1 → channel group A1, channel K1

There is thus obtained the pulse pattern shown in FIG. 5, which will now be described in further detail.

With the onset of every shift cycle (shift cycle no. 1) the conductor 66 to 67 is activated by a positive current, as a result of which a domain is nucleated at the upper end of every channel. In accordance with the data word 8B = [10001011] to be stored, conductors 1 to 3 and 26 to 29 are activated by a positive current, according to the above scheme regarding the allocation of storage locations. Their local magnetic fields effect propagation of the domains present at the upper ends of channels K8 up to those regions where channels K8 intersect the portion of the conductor starting at point 26. The domains present at the upper ends of channels K1 to K7, on the other hand, cannot be propagated because the conductors 3 to 5, 5 to 8, . . ., 15 to 17 are activated by a negative current which would cause existing domains to shrink.

The above-described domain propagation can only take place if, in addition to the conductors 1 to 3 and 26 to 29, the conductor C1 . . . C8, allocated to the channel group concerned, is activated by a positive current because the domains can then not jump the gap between the conductor systems B1 . . . B8 and B9. This makes a choice between logic "0" input values and logic "1" input values possible. If a logic "1" is to be entered, the conductor C1 . . . C8 concerned is activated with a positive current, and if a logic "0" is to be entered it stays activated with a negative current and thus blocks domain propagation.

In the present embodiment, the conductors C8, C4, C2, C1 should be activated with a positive current and the conductors C7, C6, C5, C3 with a negative current, to enable the number 8B to be stored.

If data are only to be entered but not read, then activation of conductors C1 . . . C8 can take place simultaneously with that of conductors 1 to 3 or of other channel selection conductors. Normally, however, writing will only be effected following a reading operation preceding it during the same shift cycle, as in the case described for the 65th storage cycle. This is why the data pulses in FIG. 5 (line 1 to line 8) are triggered only after a certain delay relative to the channel selection pulses (lines 17 to 24).

When the first hexadecimal number 8B has been entered, the associated domains are erased everywhere, with the exception of those at the regions where the channels K8 intersect the portion of the conductor starting at point 26, and with the exception of the domains situated at the upper channel ends, which domains have been created by conductors 66 to 67. This is done to prevent mutual interference between the stored data. Erasure is effected by the simultaneous activation of all conductors, except 26 to 29, 28 to 27 and 66 to 67, with a negative current.

The next hexadecimal number BA = 10111010 is entered in exactly the same way as in the case of the first hexadecimal number, except that this time the conductor 66 to 67 is not activated (domains at the upper channel ends are already present), that conductor 1 to 3 is replaced by conductor 3 to 5 and that the conductors C8, C6, C5, C4, C2 are activated with a positive current and the conductors C7, C3, C1 with a negative current. The number BA is stored in the eight channels K7.

The remaining six hexadecimal numbers are entered in analogous manner.

On completion of the above-described operations, the domains (or unfilled locations for logic zeros) corresponding to a total of 64 entered data bits are situated in the regions where the channels cross the portion of the conductor starting at point 26. Now the conductor 26 to 29 becomes inactive and the conductor 28 to 27 is activated with a positive current. This causes the domains to propagate and, in addition, to occupy the regions where the channels intersect the portion of the conductor starting at point 27.

Now the conductor 26 to 29 is activated once more, but this time with a negative current. The conductor 28 to 27 is de-activated at the same time. As a result, the domains situated in the regions where the right-to-left portion of the conductor starting at point 26 crosses the channels shrink, whereas they propagate up to the regions where the second (left-to-right) portion of conductor 26 to 29 crosses the channels.

Finally, the conductor 26 to 29 is de-activated and the conductor 28 to 27 activated once more with a negative current. This causes the domains to shrink in the region of the left-to-right portion of the conductor starting at point 27 and to propagate up to the regions where the channels cross the right-to-left portion of the conductor 28 to 27 (the second from above), a full shift cycle having thus been completed.

Since no readout should be performed during the shift cycle under consideration, the conductors 46/49-30/33 and 40/45-34/39 were continuously activated by a negative current, so that no domains could reach the soft magnetic regions A1 to A8 and, consequently, no readout signals were obtained.

The following shift cycles nos. 2 to 64 proceed in the same way as cycle no. 1, possibly with different input data in each case. During such additional cycles, simultaneous shifting of all previously stored data by one storage location takes place.

On completion of shift cycle no. 64, the domains stored during the first shift cycle extend from the regions where the channels cross the left-to-right portion of conductor 26 to 29 (second from below) up to the regions where the channels cross the lowest left-to-right portion of conductor 28 to 27.

As far as the writing of information and the shifting of stored domains is concerned, the pulse characteristic of shift cycle no. 65 as a function of time is identical to that already described for shift cycle no. 1.

For the purpose of data readout, the conductor system 46/49-30/33 and the conductors 1 to 3 are first activated with a positive current. This causes the domains situated in channels K8 directly above the regions H1 ... H8 (and only these domains) to propagate into these regions and to cause a complete reversal of magnetization therein. When this operation is complete, the conductor system 40/45-34/39 is activated with a positive current and the system 46/49-30/33 is de-activated. As a result, the domains contained in H1 ... H8 propagate into the regions A1 ... A8 and generate in the conductors B11 to B18 inductive voltages which, after appropriate conversion, are used as readout signals representing the stored information.

If the stored information is to be preserved beyond the 64 shift cycles, it will have to be re-entered into the storage device immediately following readout. This is achieved by simultaneously activating, at the same channel position, the comb-like channel selection conductor systems B1 ... B8 during readout, and the channel selection conductor systems C1 ... C8 during entering. This enables the readout data to be re-entered directly afterwards in the correct positions at the upper channel ends (cf. FIG. 5).

After reading the first 8-bit data word from the eight channels K8, the conductor systems 46/49-30/33 and 40/45-34/39 are activated with a negative current, so that all domains present in the regions H1 ... H8 and K1 ... K8 are erased. As has already been described in connection with shift cycle no. 1, the conductor 1 to 3 is activated by a negative current, so that the domains present in the channels K1, immediately next to the regions H1 ... H8, are erased.

The second 8-bit word from channels K7 can now be read. For this purpose, the conductor 3 to 5 is activated with a positive current, and all other operations proceed in the manner already described.

The illustrated pulse sequences are repeated eight times in all, following which the eight data words entered during the first shift cycle are read and re-entered. This 65th shift cycle is terminated with the consecutive activation of conductors 28 to 27 and 26 to 29 by positive and negative currents, as has already been described in connection with shift cycle no. 1.

The minimum durations required for the individual steps of a shift cycle are determined as quotients of the length of the distances to be traversed by the domain walls and the domain wall velocity. Experience has shown that the latter is approximately 1 mm/$\mu$s. In the system illustrated in FIGS. 1 to 5, the longest distances occur during propagation of the domains into the regions H1 to H8, being 4 mm at most (readout from channels K1). On the other hand, when domains are transferred from the regions H1 ... H8 to the regions K1 ... K8, distances of only about 1 mm in length must be traversed; this is also the case during erasure of any domains present in these regions.

During the writing of information, the domain walls have to be shifted by a total of about 1 mm (up to the uppermost portion of conductor 26 to 29).

The distances to be traversed during domain wall shifts within the channels are at most 200 $\mu$m.

The total time required for a full shift cycle is the sum of the times needed for the eight read/write operations plus the two shift operations. These amount to a maximum of $1 = 8 \times (4 + 1 + 1 + 1) \mu s + 3 \times 0.2 \mu s =$ 56.6 $\mu$s, corresponding to a possible maximum operating frequency of 17.7 kHz. This value could be increased by 25% to 22.1 kHz if the dimensions of the device described here were reduced in the direction perpendicular to the channels to such an extent that the admissible adjustment tolerance of $\Delta_s = \pm 100$ $\mu$m drops to $\Delta_w = \pm 75$ $\mu$m, corresponding to $\Delta_s = \pm 75$ $\mu$m.

The data transfer rate for a single storage substrate according to FIG. 1 is therefore $R = 22.1 \times 10^3 \times 64$ bits/s, or $R = 1.4 \times 10^6$ bits/s.

We claim:

1. A magnetic thin film storage device, comprising a flat support to which a ferromagnetic layer has been applied, which layer contains regions of different coercivity, lower-coercivity regions in the form of strip-like channels and enlarged areas being surrounded by regions of higher coercivity, and also comprising electric conductor means extending in planes parallel with the support and serving to produce local magnetic fields required to propagate magnetic domains into the lower-coercivity regions;

wherein there are provided groups of straight parallel channels, with all the channels of a group terminating in one enlarged area;

wherein the magnetic field needed for selecting a channel within a group is produced by means of a comb-like arrangement of electric conductors, the longitudinal conductor of which crosses all the channels of the group in the neighborhood of the enlarged area and the connecting leads of which extend between the channels; and wherein the magnetic fields needed for domain propagation and shrinkage is produced by a single conductor covering the entire enlarged area as well as the adjacent channel regions so that said conductor when activated causes the magnetic domains present in the channels terminating in said enlarged area to be propagated, individually and consecutively, into said enlarged area.

2. A magnetic thin film storage device, comprising a flat support to which a ferromagnetic layer has been applied, which layer contains regions of different coercivity, lower-coercivity regions in the form of strip-like channels and enlarged areas being surrounded by regions of higher coercivity, and also comprising electric conductor means extending in planes parallel with the support and serving to produce local magnetic fields required to propagate magnetic domains into the lower coercivity regions;

wherein there are provided groups of straight parallel channels, with all the channels of a group terminating in one enlarged area;

wherein the magnetic field needed for selecting a channel within a group is produced by means of a system of hairpin-shaped electric conductor paths arranged in such a way that each channel of the group is intersected, in the neighborhood of the enlarged area, by exactly one individual conductor the connecting leads of which extend between the channels; and wherein the magnetic fields needed for domain propagation and shrinkage is produced by a single conductor which covers the entire enlarged area as well as the adjacent channel regions, said conductor when activated serving to propagate the magnetic domains present in the channels terminating in said enlarged area individually and consecutively into said enlarged area.

* * * * *